United States Patent [19]

Murphy

[11] Patent Number: 4,691,075
[45] Date of Patent: Sep. 1, 1987

[54] ENERGY CONVERSION SYSTEM

[75] Inventor: Lawrence M. Murphy, Lakewood, Colo.

[73] Assignee: The United States of America as represented by the United States Department of Energy, Washington, D.C.

[21] Appl. No.: 776,731

[22] Filed: Sep. 16, 1985

[51] Int. Cl.$^4$ .......................... H02N 6/00; H01L 25/02
[52] U.S. Cl. ...................................... 136/246; 136/251
[58] Field of Search ............... 136/206, 246, 251, 259; 126/418, 424, 425

[56] References Cited

U.S. PATENT DOCUMENTS

| | | | |
|---|---|---|---|
| 4,026,267 | 5/1977 | Coleman | 126/436 |
| 4,046,462 | 9/1977 | Fletcher et al. | 350/295 |
| 4,293,731 | 10/1981 | Schweig et al. | 136/245 |
| 4,511,755 | 4/1985 | Mori | 136/246 |

OTHER PUBLICATIONS

SAN-1468-1, Solar Central Receiver Prototype Heliostat Phase I, Final Technical Report, General Electric Co., Energy Systems Programs Dept. (1977).
SAN-1604-1, Solar Central Receiver Prototype Heliostat, vol. I: Final Technical Report, Boeing Co., Boeing Engineering & Construction (1979).

Primary Examiner—Aaron Weisstuch
Attorney, Agent, or Firm—Kenneth L. Richardson; John M. Albrecht; Judson R. Hightower

[57] ABSTRACT

The energy conversion system includes a photo-voltaic array for receiving solar radiation and converting such radiation to electrical energy. The photo-voltaic array is mounted on a stretched membrane that is held by a frame. Tracking means for orienting the photo-voltaic array in predetermined positions that provide optimal exposure to solar radiation cooperate with the frame. An enclosure formed of a radiation transmissible material includes an inside containment space that accommodates the photo-voltaic array on the stretched membrane, the frame and the tracking means, and forms a protective shield for all such components. The enclosure is preferably formed of a flexible inflatable material and maintains its preferred form, such as a dome, under the influence of a low air pressure furnished to the dome. Under this arrangement the energy conversion system is streamlined for minimizing wind resistance, sufficiently weatherproof for providing protection against weather hazards such as hail, capable of using diffused light, lightweight for low-cost construction, and operational with a minimal power draw.

8 Claims, 3 Drawing Figures

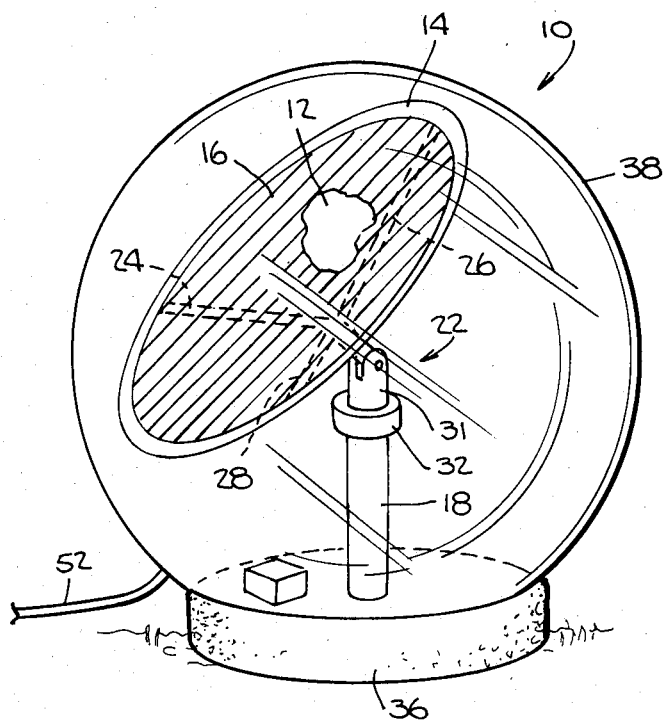
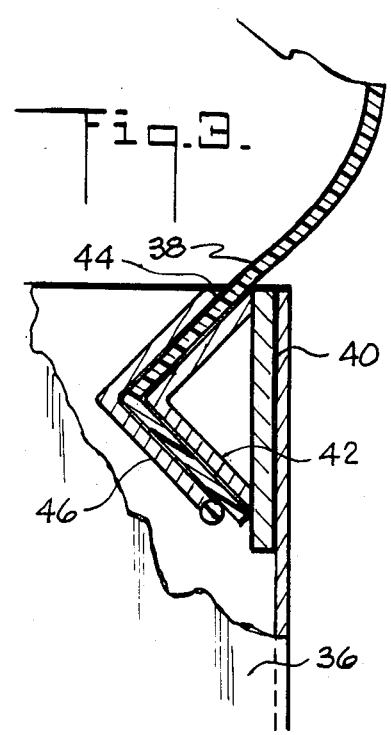
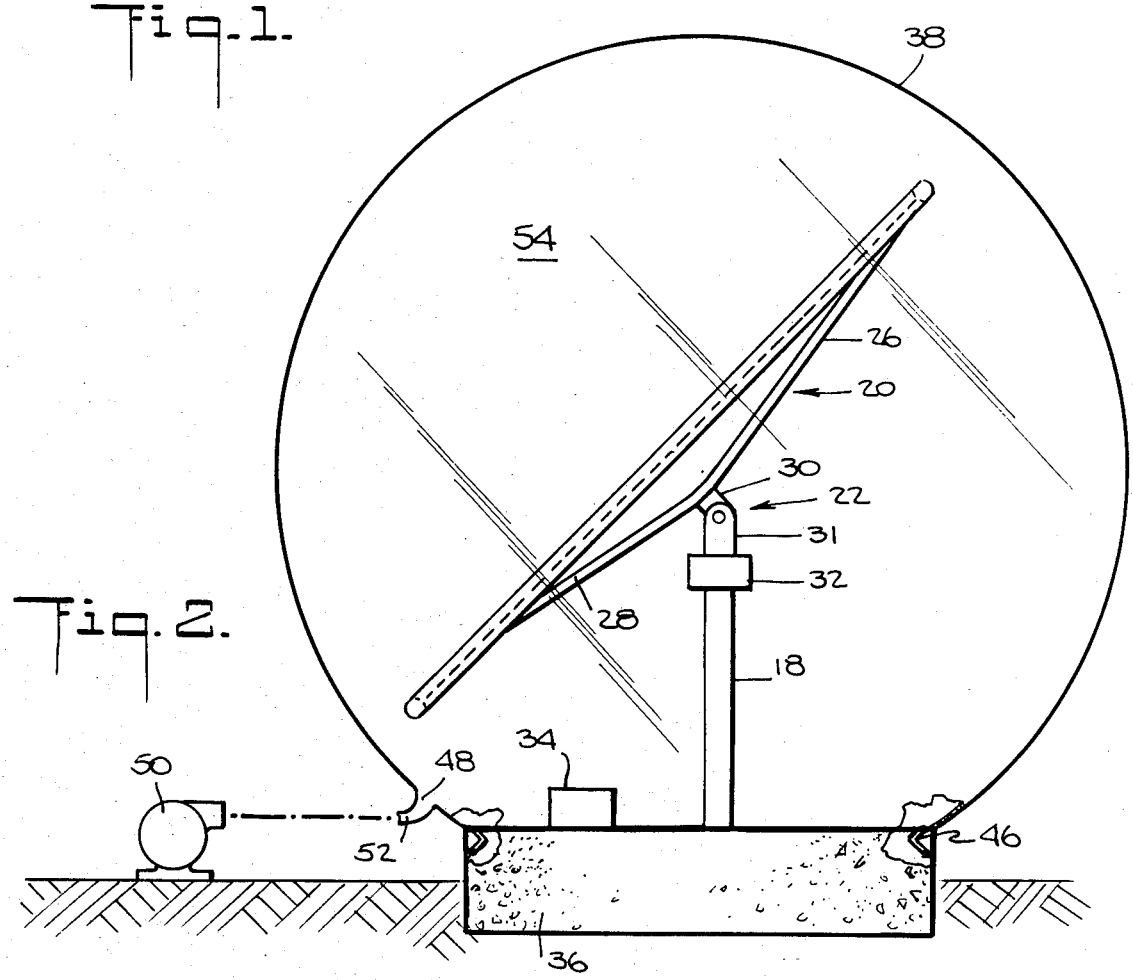

ENERGY CONVERSION SYSTEM

CONTRACTUAL ORIGIN OF THE INVENTION

The U.S. Government has rights in this invention under Contract No. DE-AC02-83CH10093 between the U.S. Department of Energy and the Solar Energy Research Institute, a Division of Midwest Research Institute.

BACKGROUND OF THE INVENTION

1. Field of the Invention

The present invention relates to energy conversion systems for converting solar radiation to electrical energy and more particularly to a dome-enclosed thin-film photovoltaic array on a stretched membrane that is self-powered to track the solar radiation.

2. Description of the Prior Art

It is well known to use a photovoltaic array in an energy conversion system that converts solar radiation to electrical energy. Photovoltaic cells in a photovoltaic array generate an electromotive force upon exposure to solar radiation causing current to flow in a circuit that includes the photovoltaic array.

The photo-voltaic cells are usually delicate crystal structures, especially those used in thin-film, photovoltaic arrays. Ideally, direct outside exposure of the photovoltaic array to solar radiation will provide optimal energy conversion. However, it is usually advisable to protect the photovoltaic (hereinafter referred to as PV) array from weather hazards such as hail, which can cause substantial damage to a PV array.

A known method of protecting PV arrays is to encapsulate them in an epoxy resin or other suitable material that is transparent to solar radiation. The encapsulation should be sufficiently strong to withstand weather hazards, such as hail storms, and prevalent wind forces. However, in obtaining the necessary encapsulation protection for the PV array some degradation in radiation transmissibility to the PV array occurs. The PV array is also usually mounted on a structure having a relatively sturdy construction to meet any prevailing wind load requirements.

Since the position of the sun relative to the PV array is one of continuous change it is well known to use a tracking apparatus to continuously orient the PV array or optimal exposure to solar radiation. The tracking apparatus must be powerful enough to overcome any wind loads on the PV array and the mounting structure and to overcome the inertia of such structure itself. Therefore, a suitable drive mechanism for the tracking system would be expected to function under prevailing wind loads and is thus likely to be quite robust and costly and to have a relatively high power consumption. The relatively high level of power consumption needed by the drive system detracts from the usable energy generated by the PV array.

SUMMARY OF THE INVENTION

Against the foregoing background, therefore, a general object of the invention is to provide a novel energy conversion system having energy conversion means and a tracking system that are protected from the wind by a lightweight, low-cost weather protection arrangement.

A further general object of the invention is to provide a novel energy conversion system having a tracking system that is less robust and less costly than tracking systems that must operate under prevailing wind loads.

Another general object of the invention is to provide a novel energy conversion system having a platform for energy conversion means that is less robust and less costly than platforms that must operate under prevailing wind loads.

A still further general object of the invention is to provide a novel energy conversion system that is streamlined for minimizing wind resistance and sufficiently weatherproof for providing protection to an energy conversion means, its platform, and its associated tracking system.

Another general object of the invention is to provide a novel energy conversion system that is capable of using diffused light.

A more specific object of the invention is to provide a novel energy conversion system having a tracking system that requires minimal power draw because of its lightweight structure and its protection from the wind.

Still another specific object of the invention is to provide a novel energy conversion system wherein a PV array is supported on a lightweight, low-cost stretched membrane inside an inflatable, flexible, dome-like enclosure that forms a protective shield for the PV array.

Still another object of the invention is to provide a novel energy conversion system employing a PV array that tracks solar radiation and wherein the tracking system is minimally robust and is disposed in a protective enclosure that also protects the PV array.

A further specific object of the invention is to provide a novel method for converting solar radiation to electrical energy.

Additional objects, advantages, and novel features of the invention shall be set forth in part in the description that follows, and in part will become apparent to those skilled in the art upon examination of the following, or may be learned by the practice of the invention. The objects and the advantages of the invention may be realized and attained by means of the instrumentalities and combinations particularly pointed out in the appended claims.

To achieve the foregoing and other objects, and in accordance with the broad purposes of the present invention, an embodied and broadly described herein, the energy conversion system of this invention includes a means for receiving solar radiation and converting such radiation to electrical energy, such as a PV array. The PV array is preferably mounted on a stretched membrane that is held by a frame.

Tracking means for orienting the PV array in predetermined positions that provide optimal exposure to solar radiation cooperate with the frame. An enclosure formed of a radiation transmissible material includes an inside containment space that accommodates the PV array on the stretched membrane, the frame, and the tracking means and forms a protective shield for all such components.

The enclosure is preferably formed of a flexible inflatable material and maintains its preferred form, such as a dome, under the influence of low positive air pressure furnished to the dome.

Under this arrangement the energy conversion system is streamlined for minimizing wind resistance, lightweight for operating with a minimal power draw, and sufficiently weatherproof for providing protection against weather hazards such as hail.

BRIEF DESCRIPTION OF THE DRAWING

The accompanying drawing of an energy conversion system, which is incorporated in and forms a part of the specification, illustrates a preferred embodiment of the present invention and together with the description explains the principles of the invention. In the drawing:

FIG. 1 is a perspective view of an energy conversion system incorporating one embodiment of the present invention;

FIG. 2 is a side elevation thereof; and,

FIG. 3 is an enlarged fragmentary sectional view of a dome securing arrangement.

Corresponding reference characters indicate corresponding parts throughout the several views of the drawing.

DETAILED DESCRIPTION OF THE PREFERRED EMBODIMENT

An energy conversion system incorporating a preferred embodiment of the invention is generally indicated by the reference number 10 in FIG. 1.

The energy conversion system 10 includes a stretched membrane 12, a portion of which is shown in FIG. 1, stretched onto a rim 14 to form a platform or mount for a PV array 16. The stretched membrane 12 is a thin film formed of a polymeric material, approximately 0.002 to 0.010 inches (50 to 250 microns) thick, preferably 0.005 to 0.006 inches thick (125 to 150 microns).

The membrane 12 can be maintained at a predetermined tension on the rim 14 in any suitable known manner. For example, the membrane 12 can be bonded or otherwise secured to the rim 14 while the rim 14 is held in compression. When the compression on the rim 14 is released, the membrane 12 becomes tensioned a predetermined amount.

Attachment of the membrane 12 to the rim 14 can also be accomplished by clamping or welding, or in a manner similar to that in which screens are attached to windows or doors wherein the membrane is forced into a crevice (not shown) around the periphery of the rim 14 with a securing bead insert (not shown).

A suitable polymeric material for the membrane 12 is sold under the trademark Flexigard manufactured by the 3M Company of Minneapolis, Minn. Suitable metallic materials for the membrane 12 are aluminum and steel.

The PV array 16 can be an array of crystalline PV cells that are made in the shape of wafers, small disks, or coupons that can be trimmed into rectangular shapes to provide adjacent side-by-side contact between the cells. PV cells of the type manufactured by The Arco Solar Company and the Solarex Company are suitable for the purposes of this invention. Another kind of PV array is formed of amorphous silicon instead of a crystalline structure. The amorphous silicon structure is formed in sheets that are larger than any of the crystal cells. The Sanyo Corporation and the Sharp Corporation manufacture amorphous silicon PV arrays suitable for the purposes of this invention.

The PV array 16, whether it be of a cell-type structure or an amorphous structure, can be bonded to the membrane 12 using a suitable adhesive.

The rim 14 is supported on a pedestal 18 by a support spider 20 that is joined to a two-axis drive shown in simplified schematic by the reference number 22. The support spider 20 includes a plurality of struts, preferably three struts 24, 26, and 28 spaced 120° apart that can be formed of steel or any other suitable material. The struts 24, 26, and 28 have one end connected to the rim 14 with the opposite ends converging toward an elevation pivot joint 30 of the two-axis drive 22. The elevation pivot joint 30, which tilts the rim 14 at desired predetermined angles, includes an ear piece 31 joined to an azimuthal pivot joint shown schematically at 32. The azimuthal pivot joint 32 swivels the ear piece 31 about an axis that is coincident with the pedestal 18. Thus the azimuthal pivot joint 32 also swivels the rim 14.

The two-axis drive 22 is of the type, but of a less robust construction than those, often used with heliostats such as manufactured by McDonnell Douglas, the Arco Solar Company, and Martin Marietta Corporation. A microcomputer for governing the movement of the two-axis drive 22 is schematically indicated by the reference number 34 in FIG. 2.

The pedestal 18, which is formed of any suitable material such as steel or concrete is rigidly affixed to a base 36, also formed of concrete, or other suitable base material.

An enclosure 38 preferably in the form of a spherical dome encloses all of the previously described components supported on the base 36. The dome 38 is a flexible, inflatable structure, preferably formed of a strong, tear resistant or rip stop polymeric material. The wall thickness of the dome is preferably in the range of 0.002 to 0.006 inches (50 to 150 microns).

The enclosure 38 is sealed against the periphery of the base 36 by any suitable clamping arrangment such as shown in FIG. 3. For example, a collar 40 having a V-shaped projection 42 is affixed to the base 36. A peripheral end portion 44 of the enclosure 38 is draped over the V-shaped projection 42 and clamped thereto by a clamping ring 46 of complementary shape to the V-shaped projection 42.

The enclosure 38 also includes an opening or valve 48, as illustrated in FIG. 2, through which air is fed by a fan 50 that communicates with the opening 48 through a tube 52. Preferably the pressure maintained in the enclosure 38 is approximately 0.02 pound to 0.1 pound per square inch. Although not shown, appropriate pressure control devices, such as a pressure relief valve, can be used to maintain the desired pressure level.

The dimensions of the energy conversion system 10 are a matter of choice. Nevertheless, to exemplify magnitudes that are considered practical, the diameter of the rim 14 can be approximately 10 meters. The enclosure 38 is preferably slightly larger to provide suitable clearance for the pivoting and swiveling rim 14.

In using the energy conversion system 10, the two-axis drive 22 is used to track the solar radiation in accordance with a suitable program furnished in the microcomputer 34. The enclosure 38 provides a tranquil space 54 that is not interfered with by the weather or deleteriously affected by prevailing winds. Thus an isolated, protected environment is provided in the enclosure space 54.

The energy produced by the PV array 16 is used to power the fan 50 and the two-axis drive 22, thereby rending the system 10 self-powered during times of insolation. The energy provided by the PV array 16 is DC power, which can be converted to AC power if desired. At night and in periods of no insolation, the power required to keep the enclosure 38 inflated can be supplied by a battery or from power drawn from an electrical grid, not herein illustrated.

Note also that the enclosure 38 can have relatively low specularity requirements since the solar radiation is merely received by the PV array and is not reflected. Thus neither the wall of the enclosure 38 nor the membrane 12 supporting the PV array need have an optical surface of high accuracy, especially since diffuse light at the enclosure 38 is received by the PV array 16. Consequently the solar radiation need not pass through the enclosure 38 to the PV array in a straight beam. Therefore, the enclosure 38 may be translucent if desired. In a practical sense, the membrane films, such as those described above for the enclosure 38, can be transparent to the extent of being able to see through the film; however, it does not have to be so specularly transparent that light rays enter and leave the film without scattering, i.e., that no diffusion occurs. On the contrary, since the PV cells can function quite effectively regardless of whether the incident solar radiation is direct or has been distorted or scattered, the film membrane 38 can be made of a material that causes some distortion or scattering of solar radiation transmitted therethrough, i.e., specularly translucent. Consequently, the film membrane 38 can be made of materials that are quite strong and not subject to being ripped or punctured by hail or other airborne debris in a storm. Polymeric materials such as those available under the trademarks Tefzel made by Dupont and Halar made by Allied Chemical are satisfactory for this purpose.

Some advantages of the invention evident from the foregoing description are an energy conversion system 10 that provides a protective shield for PV array 16, which permits the PV array 16 to be mounted on a stretched membrane 12, which is a low-cost platform, thereby allowing the use of a low-power draw solar tracking arrangement. Since the tension level on the enclosure 28 is fairly low, the impact of hail on the enclosure wall surface will have only minimal effect. Any surface deflections of the enclosure 38 caused by to hail will be corrected by the compliant condition of the enclosure material under the influence of the pressurized space 54. Furthermore, since the PV array 16 and its platform are lightweight and protected from the wind, a minimally robust and low-cost tracking system can be used. The tracking system has a low power draw because of the lightweight structure and because of its protection from the wind. In addition, the PV array 16 requires a very low-accuracy tracking device because it has the capability of using diffused light. Therefore since the system is operable with a very low-cost tracking device, because of its capability of using diffused light it can function with a low-cost drive system.

The foregoing is considered as illustrative only of the principles of the invention. Further, since numerous modifications and changes will readily occur to those skilled in the art, it is not desired to limit the invention to the exact construction and operation shown and described; accordingly all suitable modifications and equivalents may be resorted to falling within the scope of the invention as defined by the claims that follow.

The embodiments of the invention in which an exclusive property or privilege is claimed are defined as follows:

1. Light-weight and self-contained solar energy conversion apparatus for converting solar radiation to electrical energy, comprising:
   an array of photovoltaic cells mounted on a thin film substrate membrane and connected together to provide an electric power source, said thin film being stretched and mounted on a circular rim;
   support means connected to said rim for supporting said array of photovoltaic cells in a position adapted to be exposed to solar radiation, said support means being adjustable about two orthogonal axes and having strength design parameters sufficient to support the array, substrate membrane, and rim safely in a still atmosphere without regard to ambient outside wind and hail loads; and
   a substantially spherical dome positioned over and enclosing a chamber around said array of photovoltaic cells and support means, said dome being comprised of a specularly translucent, flexible, thin film material anchored around said support means and inflated to a pressure in the chamber in the range of about 0.02 to 0.10 pounds per square inch more than the pressure outside the chamber, the thin film material of said dome also being tear-resistant and sufficiently strong to withstand normal wind and hail storm forces and having sufficient resilience to yield without puncturing to hail stones, yet to recover to its spherical surface shape under the urging of the inflation pressure in the chamber.

2. The apparatus of claim 1, wherein said rim is substantially circular and positioned substantially concentric with said dome enclosure and said substrate is stretched in a flat plane over said rim and the photovoltaic cells of said array are mounted in said chamber on said substrate film in such a manner that they are exposed directly to solar radiation, including scattered solar radiation, in the chamber with no intervening lens, solid light conductors, and light shielding over the photovoltaic cells.

3. The apparatus of claim 2, including tracking drive means positioned in said chamber and connected mechanically to said support means for maintaining said array approximately facing the sun and connected electrically to said array for powering said tracking drive means with electrical energy produced by said array, and including inflating means positioned adjacent said dome for blowing air into said dome to maintain said pressure therein, said inflating means also being connected electrically to said array for powering said inflating means with electrical power produced by said array.

4. The apparatus of claim 3, including a substantially circular base, said support means being anchored in said base, and said base having an annular collar around its periphery, the edges of said thin film material of said dome being draped over said collar and clamped to the base by a substantially circular clamp abutted against the collar with the thin film dome material positioned between the clamp and the collar.

5. A method of converting solar radiation from the sun to electrical energy, comprising the steps of:
   stretching a thin film membrane substrate over a substantially circular frame and affixing the substrate in stretched condition to said frame to form a flat planar substrate in the scope of a circle;
   mounting a plurality of photovoltaic cells in an array on one side of said flat planar substrate and electrically connecting them together to arrange said array into an electric power source;
   mounting said frame on a support structure that is strong enough to support the frame, substrate membrane, and array in a still environment but not designed and built strong enough to support these components under wind and hail loads and which is capable of adjusting said array about two orthogonal axes and adjusting the support structure to maintain the array oriented approximately perpendicular to a line extending between the sun and the center of the array;

positioning a large, flexible, thin film enclosure membrane that is tear resistant and specularly translucent concentrically over said array, to enclose said array, substrate, frame, and support structure assembly, sealing the edges of the enclosure membrane, and inflating the enclosure to form an interior chamber over and around said assembly that is enclosed by the enclosure membrane, and maintaining the pressure inside the chamber to a sufficient amount to support the enclosure film in a semi-rigid structure over the assembly.

6. The method of claim 5 including the steps of mounting the support structure on a rigid circular base and fastening and sealing the edges of the enclosure membrane around the periphery of the circular base by draping the edges over an annular collar around the periphery and clamping the edges between the collar and a clamping ring.

7. The method of claim 5, including the steps of connecting electrically powered drive means to said support structure, powering said drive means with electric power produced by said array, and controlling the drive means to adjust the orientation of the array automatically to maintain said perpendicular relation between the array and the sun.

8. The method of claim 7, including the steps of maintaining said pressure in said chamber by positioning an electrically powered blower adjacent said enclosure with a duct connecting the blower to the interior chamber and powering said blower with electrical power produced by said array.

* * * * *